United States Patent [19]
Hamlin

[11] Patent Number: 5,730,619
[45] Date of Patent: Mar. 24, 1998

[54] EXTERNALLY LOCKED CONNECTOR

[75] Inventor: Gary Joe Hamlin, Windham, Ohio

[73] Assignee: General Motors Corporation, Detroit, Mich.

[21] Appl. No.: 674,295

[22] Filed: Jul. 1, 1996

[51] Int. Cl.$^6$ ................................................ H01R 9/07
[52] U.S. Cl. ............................. 439/493; 439/67; 439/573
[58] Field of Search ............................ 439/493, 67, 77, 439/573

[56] References Cited

U.S. PATENT DOCUMENTS

| | | | |
|---|---|---|---|
| 4,252,389 | 2/1981 | Olsson | 439/493 |
| 4,948,374 | 8/1990 | Carter | 439/67 |
| 5,051,366 | 9/1991 | Anderson et al. | 439/77 |
| 5,240,420 | 8/1993 | Roberts | 439/62 |
| 5,295,838 | 3/1994 | Walen et al. | 439/67 |

Primary Examiner—Neil Abrams
Assistant Examiner—Yong Ki Kim
Attorney, Agent, or Firm—Cary W. Brooks

[57] ABSTRACT

Generally, the invention includes a connector system for making an electrical connection between a first flexible circuit having raised features and another device such as a second flexible circuit, a printed circuit board, or semi-conductor device. The flexible circuit, printed circuit board or semi-conductor device have contact pads for mating with the raised feature of the first flexible circuit. A mounting bar is provided and a leaf spring(s) secured thereto. The raised features of the first flexible circuit that are aligned and overlie the leaf spring(s). The second flexible circuit, printed circuit board or semi-conductor device is positioned so that the contact pad mates to the raised features on the first flexible circuit. Posts extend upward from the mounting bar, and a slide locking bar having slots formed therein is slid around the post to lock the first flexible circuit and the other device in a mating arrangement.

9 Claims, 2 Drawing Sheets

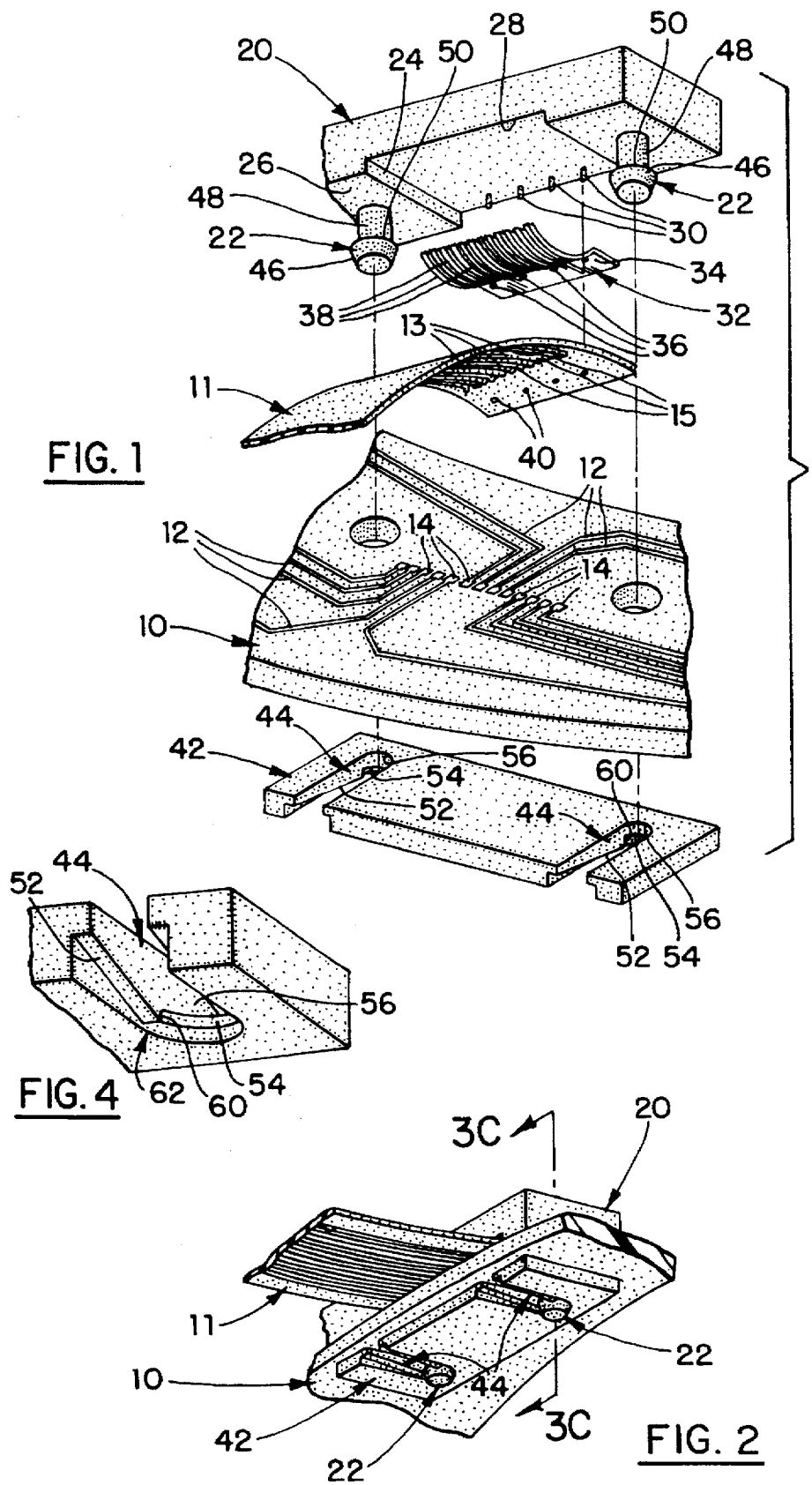

EXTERNALLY LOCKED CONNECTOR

FIELD OF THE INVENTION

This invention relates to electrical connectors, and more particularly, to a connector for making electrical connection between a flexible circuit and another device.

BACKGROUND OF THE INVENTION

A variety of electrical connectors are known for making connections between a flexible circuit and another device such as a printed circuit board. Walen et al, U.S. Pat. No. 5,295,838 discloses such a system. Walen et al describes a system including a rigid circuit board having contact pads defined thereon and a flexible circuit having raised features extending above a flat surface of the flexible circuit. The raised features are aligned for mating with the contact pads on the printed circuit board. An elongated pressure bar overlies the flexible circuit in the area where the raised features are located. The pressure bar has a plurality of holes formed therein and a coil spring is received in each hole and are aligned to match the location of the raised features on the flexible circuit. A clamping bar overlies the pressure bar and is secured to the circuit board by screws extending through the clamping bar and into the circuit board. This system has numerous parts that require a substantial amount of cost and labor to assemble.

The present invention provides advantages and alternatives over the prior art.

SUMMARY OF THE INVENTION

Generally, the invention includes a connector system for making an electrical connection between a first flexible circuit having raised features and another device such as a second flexible circuit, a printed circuit board, or semiconductor device. The flexible circuit, printed circuit board or semi-conductor device have contact pads for mating with the raised feature of the first flexible circuit. A mounting bar is provided and a leaf spring(s) secured thereto. The raised features of the first flexible circuit that are aligned and overlie the leaf spring(s). The second flexible circuit, printed circuit board or semi-conductor device is positioned so that the contact pad mates to the raised features on the first flexible circuit. Posts extend upward from the mounting bar, and a slide locking bar having slots formed therein is slid around the post to lock the first flexible circuit and the other device in a mating arrangement.

These and other objects, features and advantages of the present invention will become apparent from the following brief description of the drawings, detailed description and appended claims and drawings.

BRIEF DESCRIPTION OF THE DRAWINGS

FIG. 1 is an exploded view of a connector system according to the present invention;

FIG. 2 is a perspective view of a connector system according to the present invention;

FIG. 4 is an enlarged view of a portion of a slide locking bar according to the present invention.

DETAILED DESCRIPTION

Figure 3A:
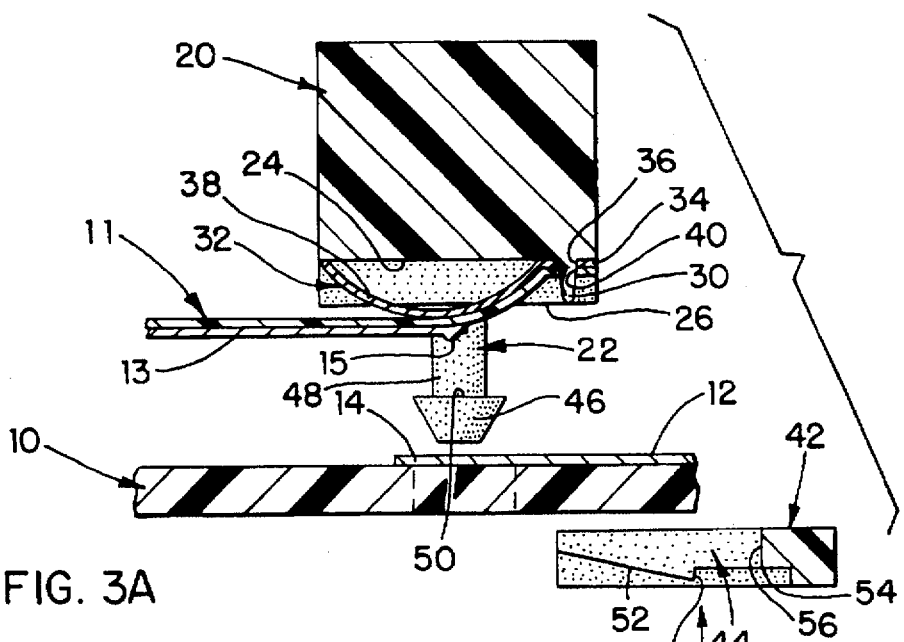
FIGS. 3A–3C are sectional views of a connector system according to the present invention.
Figure 3B:
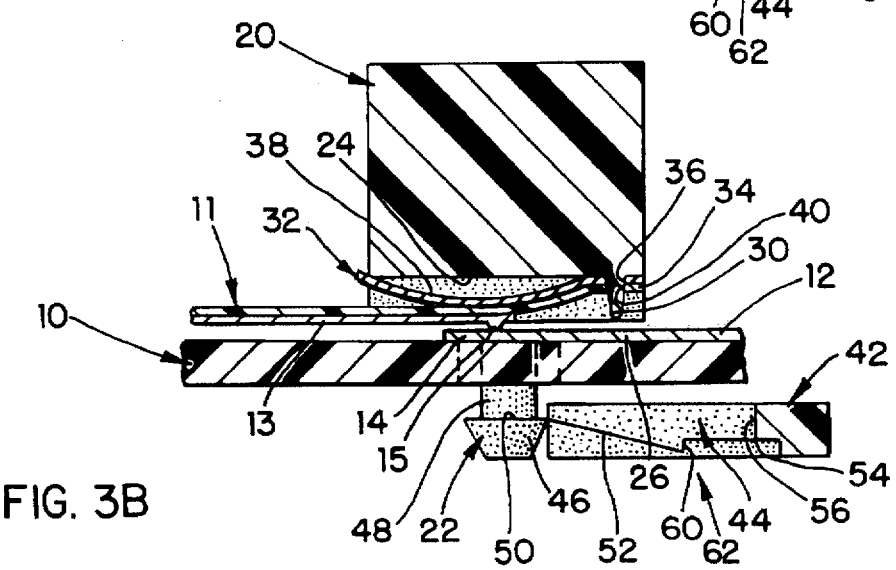
Figure 3C:
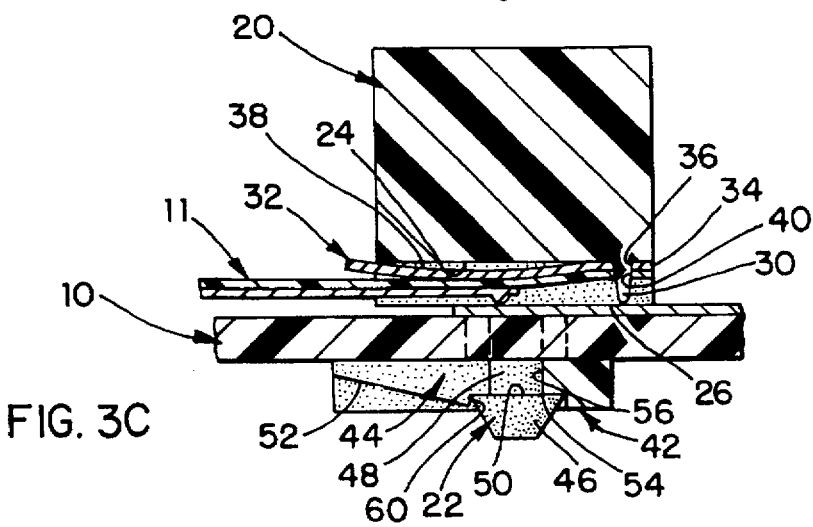

A device is provided such as a flexible circuit, printed circuit board 10 or semi-conductor device having electrical traces 12 and electrical contact pads 14 for making connection to a flexible circuit 11. The flexible circuit 11 includes exposed portions or raised features 15 extending from an electrical trace 13 of the flexible circuit for mating with the contact pads 14 on the device. The raised features are the sole means of making contact with the contact pad as opposed to traditional male/female terminals. The raised features may be made by a variety of methods known to those skilled in the art which may include but are not limited to the methods described in Moulin, U.S. Pat. No. 4,453,795, for a Cable-to-Cable/Component Electrical Pressure Wave Connector Assembly, and U.S. Pat. No. 4,125,310 for an Electrical Connector Assembly Utilizing Wafers for Connecting Electrical Cables, the disclosures of which are both hereby incorporated herein by reference. Alternatively, the raised features may be provided by a mandrel process described in Crumly et al, U.S. Pat. No. 5,207,887, for a Semi-Additive Circuitry with Raised Features Using Formed Mandrels, the disclosure of which is hereby incorporated by reference. Likewise, the raised features may be made simply by mechanically forcing a tool into a contact pad of a flexible circuit to produce the raised feature.

A mounting bar 20 is provided and includes at least two posts 22 extending outward from a first surface 26 of the mounting bar. Preferably the mounting bar includes a recess 24 formed in the first surface 26 and wherein the recess is defined at least in part by a second surface 28 beneath the first surface 26. Nubs 30 extend from the second surface 28. A leaf spring 32 is provided having an elongated base section 34 which has a plurality of holes 36 formed therein so that the leaf spring may be frictionally mounted over the nubs 30 on the mounting bar. Preferably the leaf spring has a plurality of spaced apart fingers 38 which extend beyond the first surface 26 of the mounting bar. A flexible circuit 16, leaf spring and each raised features 15 are positioned so that the fingers 38 exert a force behind the electrical traces for biasing the raised feature 15 against the contact pad 14. The raised features are positioned at the highest point on the leaf spring. Preferably the flexible circuit also includes a plurality of holes 40 formed therein for receiving the nubs 30 and thereby aligning the flexible circuit in proper position. The device overlies the flexible circuit and is positioned so that the contact pads 14 engage the raised features 15 of the flexible circuit.

A slide locking bar 42 is provided and includes a slot 44 for each of the posts 22 on the mounting bar. The slide locking bar is slid around the post so that the spring(s) is compressed and the flexible circuit and device are locked in a mating relationship. Preferably, the post includes a button top 46 having a width greater than a body portion 48 of the post so that a surface 50 extending from the body portion 48 to the outer edge of the button top 46 frictionally engages a ramped surface 52 of the slide lock bar. Preferably, the slots are defined by a pair of spaced apart ramped surfaces 52 which terminate at a downwardly extending vertical wall 60 to define an abutment 62. A flat semi-annular seat 54 extends from the vertical wall 60 and receives the button top 46 of the post. As the slide locking bar is moved around the post, an undersurface 50 of the button top engages the ramped surfaces 52 and comes to rest on the semi-annular seat. Preferably a wall 56 extends from the semi-annular seat which acts as a stop preventing further movement of the slide locking bar. The button top 46 engages the vertical wall 60 or abutment 62 which locks the button top 42 in position on the seat 54. To unlock the connector, pressure is applied to locking bar 42 to compress the spring(s) enough no that the bottom surface 50 of the button top extends above the vertical wall or abutment 62 and the button can slide down the ramped surfaces 52.

What is claimed is:

1. An assembly comprising:

a flexible circuit having raised features as the sole element for making electrical connection between the flexible circuit and another device, a mounting bar having at least two posts extending from a top surface and a plurality of nubs extending upwardly from the top surface, a leaf spring having an elongated base portion having a plurality of holes formed therein for frictionally mounting the leaf spring over the nubs on the top surface of the mounting bar, said flexible circuit overlying said leaf spring so that said raised features are biased upward by said spring, a device having electrical contact pads overlying the flexible circuit and positioned so that the raised features are mated with the contact pads on the device, a slide locking bar having a slot for each post extending upwardly from the mounting bar for sliding around said post and locking said flexible circuit and said device in a mating relationship.

2. An assembly as set forth in claim 1 wherein said leaf spring comprises a plurality of spaced apart fingers, each finger positioned to engage the underside of the flexible circuit at a location associated with a raised feature to apply pressure thereto.

3. An assembly as set forth in claim 1 wherein said upwardly extending post comprises a body portion having a first width and button top portion having a second width greater than said first width and said button having a lower engagement surface extending from said body portion for frictionally engaging a surface on said slide locking bar.

4. An assembly as set forth in claim 3 wherein said slide locking bar includes a pair of spaced apart ramped surfaces defining said slot and wherein said ramped surfaces terminate at a vertical wall extending down to a semi-annular seat.

5. An assembly as set forth in claim 1 wherein said flexible circuit includes a plurality of holes formed therein, each hole for receiving one of said nubs and so that said flexible circuit is properly aligned for mating with the contact pad on said device.

6. An assembly as set forth in claim 1 wherein a portion of said leaf spring is received in a recess defined in said top surface.

7. An assembly as set forth in claim 1 wherein said device comprises a substantially rigid printed circuit board.

8. An assembly as set forth in claim 1 wherein said device comprises a second flexible circuit.

9. An assembly as set forth in claim 1 wherein said device comprises a semi-conductor device.

* * * * *